(12) United States Patent
Jung et al.

(10) Patent No.: US 10,600,650 B2
(45) Date of Patent: Mar. 24, 2020

(54) SEMICONDUCTOR DEVICE AND MANUFACTURE THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Dae Sub Jung, Shanghai (CN); De Yan Chen, Shanghai (CN); Guang Li Yang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/964,447

(22) Filed: Apr. 27, 2018

(65) Prior Publication Data
US 2018/0315603 A1    Nov. 1, 2018

(30) Foreign Application Priority Data

Apr. 28, 2017   (CN) .......................... 2017 1 0299097

(51) Int. Cl.
*H01L 21/04*     (2006.01)
*H01L 29/06*     (2006.01)
(Continued)

(52) U.S. Cl.
CPC ...... *H01L 21/0465* (2013.01); *H01L 21/0455* (2013.01); *H01L 21/266* (2013.01);
(Continued)

(58) Field of Classification Search
CPC ............. H01L 29/1095; H01L 29/7835; H01L 29/0878; H01L 21/0415; H01L 21/0456; H01L 21/74; H01L 21/0455
See application file for complete search history.

(56) References Cited

U.S. PATENT DOCUMENTS

| | | | |
|---|---|---|---|
| 5,796,147 A * | 8/1998 | Ono ..................... | H01L 27/0218 257/355 |
| 2004/0135141 A1* | 7/2004 | Pequignot .......... | H01L 27/0255 257/46 |

(Continued)

*Primary Examiner* — Zandra V Smith
*Assistant Examiner* — John M Parker
(74) *Attorney, Agent, or Firm* — Innovation Counsel LLP

(57) ABSTRACT

A semiconductor device and its manufacturing method, relating to semiconductor techniques. The semiconductor device manufacturing method comprises: forming a patterned first hard mask layer on a substrate to define a position for buried layers; conducting a first ion implantation using the first hard mask layer as a mask to form a first buried layer and a second buried layer both having a first conductive type and separated from each other at two sides of the first hard mask layer in the substrate; conducting a second ion implantation to form a separation region with a second conductive type opposite to the first conductive type in the substrate between the first and the second buried layers; removing the first hard mask layer; and forming a semiconductor layer on the substrate. This inventive concept reduces an area budget of a substrate and simplifies the manufacturing process.

7 Claims, 10 Drawing Sheets

(51) Int. Cl.
*H01L 21/3115* (2006.01)
*H01L 21/28* (2006.01)
*H01L 21/74* (2006.01)
*H01L 21/266* (2006.01)

(52) U.S. Cl.
CPC .... *H01L 21/2822* (2013.01); *H01L 21/31155* (2013.01); *H01L 21/74* (2013.01); *H01L 29/0623* (2013.01)

(56) References Cited

U.S. PATENT DOCUMENTS

2012/0286362 A1* 11/2012 Chan .................. H01L 21/8249
                                                                                 257/337
2017/0222050 A1* 8/2017 Chen ................. H01L 21/26513

* cited by examiner

SEMICONDUCTOR DEVICE AND MANUFACTURE THEREOF

CROSS-REFERENCE TO RELATED APPLICATION

This application claims priority to and benefit of Chinese Patent Application No. 201710299097.4 filed on Apr. 28, 2017, which is incorporated herein by reference in its entirety.

BACKGROUND

(a) Field of the Invention

This inventive concept relates generally to semiconductor techniques, and more specifically, to a semiconductor device and its manufacturing method.

(b) Description of the Related Art

In a semiconductor manufacturing process, a buried layer is frequently used to insulate a region above it from a region below it (e.g., to insulate a semiconductor layer above the buried layer from a substrate below it). To achieve a good vertical insulation, the buried layer usually has a high doping concentration. If different buried layers need to be insulated from each other, they must maintain a relatively large inter-layer distance, which results in a large area budget of a substrate.

SUMMARY

Based on the investigation to the issues in conventional techniques, this inventive concept proposes an innovative solution that reduces an area budget of a substrate and simplifies the manufacturing process.

This inventive concept first presents a semiconductor device manufacturing method, comprising:
forming a patterned first hard mask layer on a substrate;
conducting a first ion implantation using the first hard mask layer as a mask to form a first buried layer at a first side of the first hard mask layer and a second buried layer at a second side of the first hard mask layer in the substrate, with the first and the second buried layers separated from each other and both having a first conductive type;
conducting a second ion implantation to form a separation region in the substrate between the first buried layer and the second buried layer, wherein the separation region has a second conductive type opposite to the first conductive type;
removing the first hard mask layer; and
forming a semiconductor layer on the substrate.

Additionally, in the aforementioned method, the second ion implantation may form a first doped region underneath the first buried layer and a second doped region underneath the second buried layer in the substrate, with the first and the second doped regions both having the second conductive type.

Additionally, the aforementioned method may further comprise conducting an annealing process after the semiconductor layer is formed, and in the aforementioned method, the first and the second buried layers may both comprise a first dopant and a second dopant, with the second dopant having a lighter atomic weight than the first dopant, and the annealing process may cause at least a portion of the second dopant in the first and the second buried layers to diffuse to the semiconductor layer to form a first diffuse region on the first buried layer and a second diffuse region on the second buried layer in the semiconductor layer.

Additionally, in the aforementioned method, the annealing process may cause at least a portion of a dopant in the separation region to diffuse to the semiconductor layer to form a third diffuse region on the separation region in the semiconductor layer.

Additionally, the aforementioned method may further comprise:
forming a first connection component and a second connection component, with the first connection component extending from an upper surface of the semiconductor layer to the first diffuse region, and the second connection component extending from the upper surface of the semiconductor layer to the second diffuse region; and
forming a third connection component extending from the upper surface of the semiconductor layer to the third diffuse region, wherein the first and the second connection components both have the first conductive type and the third connection component has the second conductive type.

Additionally, in the aforementioned method, forming a first connection component and a second connection component may comprise:
forming a patterned second hard mask layer on the semiconductor layer, with the second hard mask layer having a first opening and a second opening each exposing a portion of the semiconductor layer;
conducting a third ion implantation to dope the portion of the semiconductor layer underneath the first opening and the second opening to form the first connection component and the second connection component, respectively; and removing the second hard mask layer.

Additionally, in the aforementioned method, forming a third connection component may comprise:
forming a patterned third hard mask layer on the semiconductor layer, with the third hard mask layer having a third opening exposing a portion of the semiconductor layer;
conducting a fourth ion implantation to dope a portion of the semiconductor layer underneath the third opening to form the third connection component; and
removing the third hard mask layer.

Additionally, the aforementioned method may further comprise:
forming a first contact in the first connection component, and forming a first contact component on the first contact;
forming a second contact in the second connection component, and forming a second contact component on the second contact; and
forming a third contact in the third connection component, and forming a third contact component on the third contact.

This inventive concept further presents another semiconductor device manufacturing method, comprising:
forming a patterned first hard mask layer on a substrate;
conducting a first ion implantation using the first hard mask layer as a mask to form a first buried layer at a first side of the first hard mask layer and a second buried layer at a second side of the first hard mask layer in the substrate, wherein the first and the second buried layers are separated from each other, both have a first conductive type and both comprise a first dopant and a second dopant, with the second dopant having a lighter atomic weight than the first dopant;
removing the first hard mask layer;
forming a semiconductor layer on the substrate;
conducting an annealing process to cause at least a portion of the second dopant in the first and the second buried layers to diffuse to the semiconductor layer to form a first diffuse region on the first buried layer and a second diffuse region on the second buried layer in the semiconductor layer; and forming a first connection component and a second connection component, with the first connection component extending from an upper surface of the semiconductor layer to the first diffuse region, the second connection component extending from the upper surface of the semiconductor layer to the second diffuse region, and the first and the second connection components both having the first conductive type.

Additionally, in this semiconductor device manufacturing method, forming a first connection component and a second connection component may comprise:

forming a patterned second hard mask layer on the semiconductor layer, with the second hard mask layer having a first opening and a second opening each exposing a portion of the semiconductor layer;

conducting a second ion implantation to dope the portion of the semiconductor layer underneath the first opening and the second opening to form the first connection component and the second connection component, respectively; and removing the second hard mask layer.

Additionally, this semiconductor device manufacturing method may further comprise:

forming a first contact in the first connection component, and forming a first contact component on the first contact; and forming a second contact in the second connection component, and forming a second contact component on the second contact.

This inventive concept further presents a semiconductor device, comprising:

a substrate, comprising:
a first buried layer and a second buried layer separated from each other;
a separation region between the first buried layer and the second buried layer;
a first doped region underneath the first buried layer; and
a second doped region underneath the second buried layer, and
a semiconductor layer on the substrate, wherein the first and the second buried layers both have a first conductive type, while the separation region, the first doped region, and the second doped region all have a second conductive type opposite to the first conductive type.

Additionally, in this aforementioned semiconductor device, the first and the second buried layers may both comprise a first dopant and a second dopant, with the second dopant having a lighter atomic weight than the first dopant, and the semiconductor layer may comprise a first diffuse region on the first buried layer and a second diffuse region on the second buried layer, with the first and the second diffuse regions both comprising the second dopant.

Additionally, in the aforementioned semiconductor device, the semiconductor layer may further comprise a third diffuse region on the separation region.

Additionally, the aforementioned semiconductor device may further comprise:

a first connection component extending from an upper surface of the semiconductor layer to the first diffuse region;
a second connection component extending from the upper surface of the semiconductor layer to the second diffuse region; and
a third connection component extending from the upper surface of the semiconductor layer to the third diffuse region, wherein the first and the second connection components both have the first conductive type and the third connection component has the second conductive type.

Additionally, the aforementioned semiconductor device may further comprise:

a first contact in the first connection component, and a first contact component on the first contact;
a second contact in the second connection component, and a second contact component on the second contact; and
a third contact in the third connection component, and a third contact component on the third contact;

This inventive concept further presents yet another semiconductor device, comprising:

a substrate, comprising:
a first buried layer and a second buried layer separated from each other in the substrate, wherein the first and the second buried layers both have a first conductive type and both comprise a first dopant and a second dopant, with the second dopant having a lighter atomic weight than the first dopant;
a semiconductor layer on the substrate, comprising a first diffuse region on the first buried layer and a second diffuse region on the second buried layer, with the first and the second diffuse regions both comprising the second dopant;
a first connection component extending from an upper surface of the semiconductor layer to the first diffuse region; and
a second connection component extending from the upper surface of the semiconductor layer to the second diffuse region, with the first and the second connection components both having the first conductive type.

Additionally, this semiconductor device may further comprise:

a first contact in the first connection component, and a first contact component on the first contact; and
a second contact in the second connection component, and a second contact component on the second contact.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
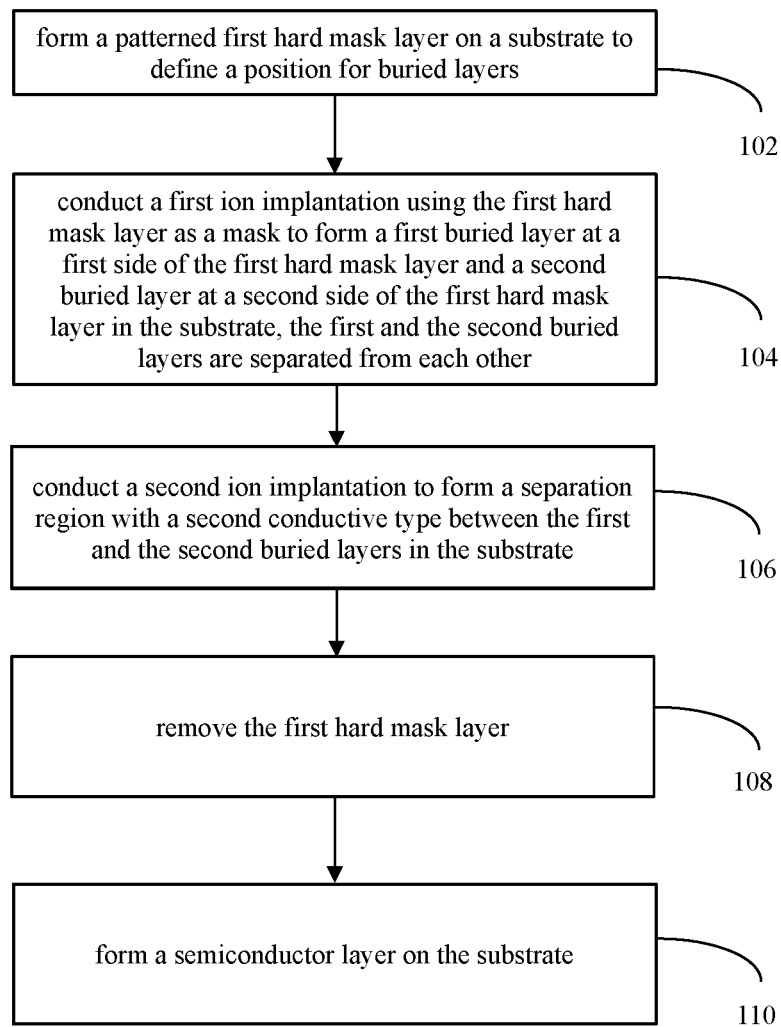
FIG. 1 shows a simplified flowchart illustrating a semiconductor device manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a simplified flowchart illustrating a semiconductor device manufacturing method in accordance with one embodiment of this inventive concept, and FIGS. 2A, 2B, 2C, 2D, 2E, 2F, 2G and 2H show schematic sectional views illustrating different stages of this semiconductor device manufacturing method. This semiconductor device manufacturing method is described below with reference to these drawings.

Figure 2A:
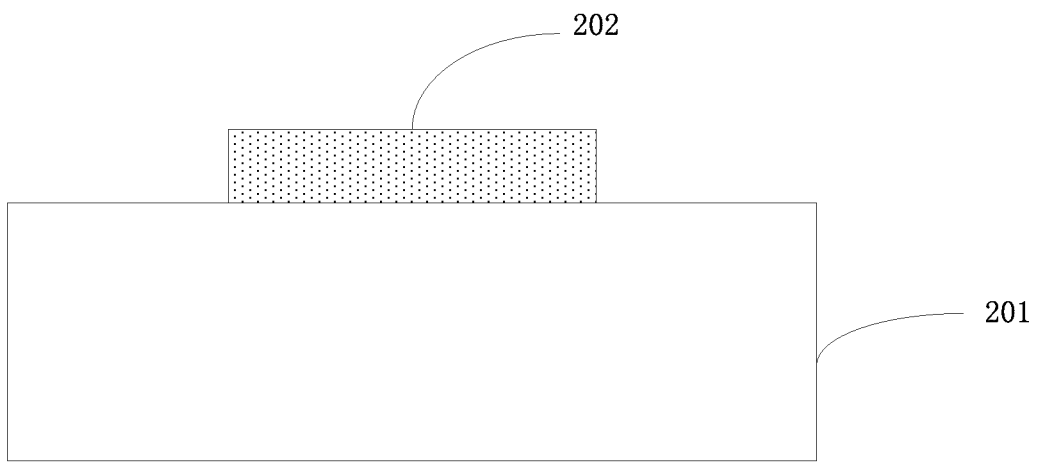
FIGS. 2A, 2B, 2C, 2D, 2E, 2F, 2G and 2H show schematic sectional views illustrating different stages of a semiconductor device manufacturing method in accordance with one embodiment of this inventive concept.

First, referring to FIG. 1, in step 102, a patterned first hard mask layer 202 is formed on a substrate 201 to define a position for buried layers, as shown in FIG. 2A. The substrate 201 may be a silicon substrate or a III-VI group semiconductor substrate, and the first hard mask layer 202 may be a photoresist.

Figure 2B:
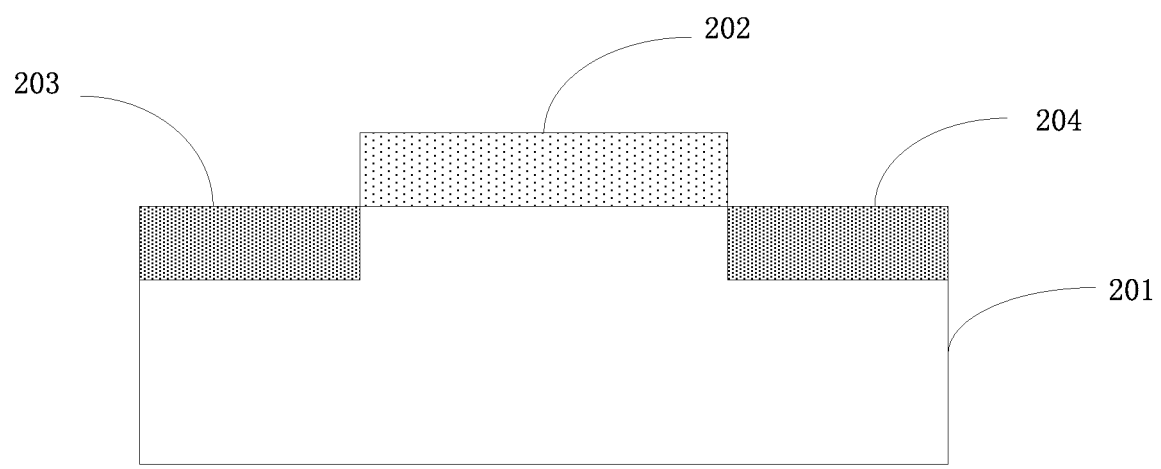

Next, in step 104, a first ion implantation using the first hard mask layer 202 as a mask is conducted to form a first buried layer 203 at a first side of the first hard mask layer 202 and a second buried layer 204 at a second side of the first hard mask layer 202 in the substrate 201, the first and the second buried layers are separated from each other, as shown in FIG. 2B.

In one embodiment, the first buried layer 203 and the second buried layer 204 may both have a first conductive type (e.g., N-type), and both comprise a first dopant and a second dopant, with the second dopant having a lighter atomic weight than the first dopant. For example, the first dopant may be antimony (Sb), which has a relatively large atomic weight, and the second dopant may be phosphorus (P), which has a relatively small atomic weight. The quantity of the first dopant may be larger than that of the second dopant.

Figure 2C:
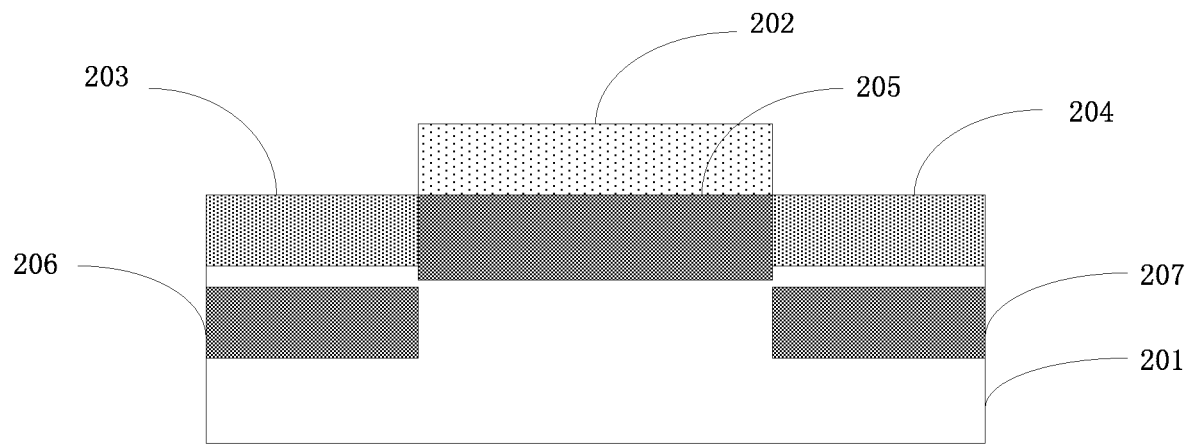

Next, in step 106, a second ion implantation is conducted to form a separation region 205 with a second conductive type between the first buried layer 203 and the second buried layer 204 in the substrate 201, as shown in FIG. 2C.

The second conductive type (e.g. P-type) may be opposite to the first conductive type. The energy for the second ion implantation is high enough to ensure the ions can penetrate the first hard mask layer 202 and reach the substrate 201 beneath. The separation region 205 formed in this process separates the first buried layer 203 and the second buried layer 204. Referring to FIG. 2C, in one embodiment, when the second ion implantation has a sufficiently high energy, it may also form a first doped region 206 underneath the first buried layer 203, and a second doped region 207 underneath the second buried layer 204 in the substrate 201, with the first doped region 206 and the second doped region 207 both having the second conductive type.

Figure 2D:
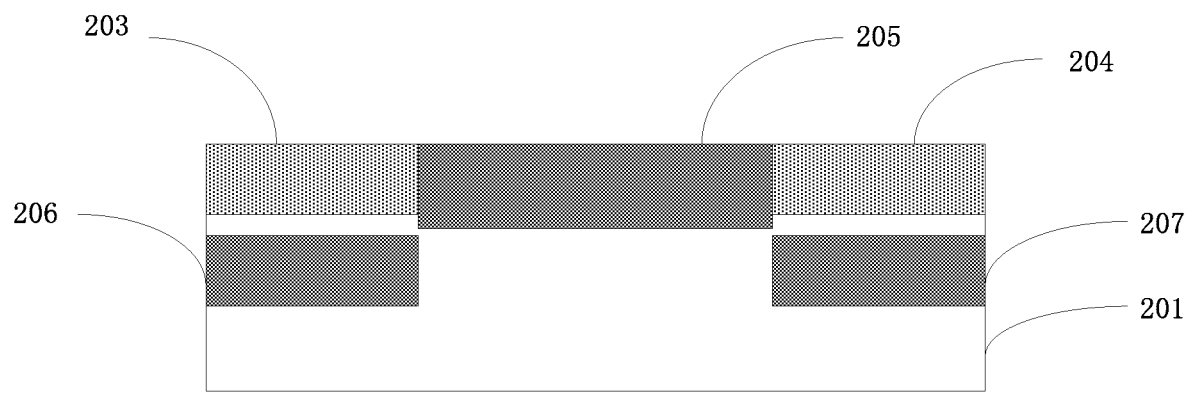

Next, in step 108, after the separation region 205 is formed, the first hard mask layer 202 is removed, as shown in FIG. 2D.

Figure 2E:
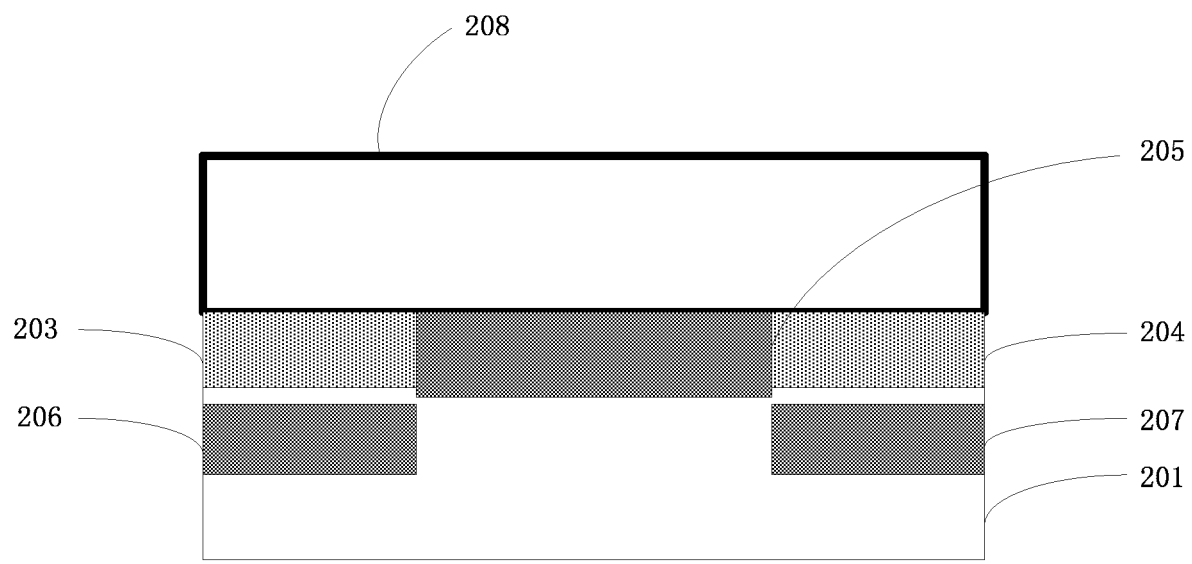

Next, in step 110, after the first hard mask layer 202 is removed, a semiconductor layer 208 is formed on the substrate 201, as shown in FIG. 2E. The semiconductor layer 208 may be formed on the first buried layer 203, the second buried layer 204, and the separation region 205, and may be used for forming various semiconductor devices. In one embodiment, the semiconductor layer 208 may be made of silicon or germanium, and may be formed by epitaxial growth.

This concludes the description of a semiconductor device manufacturing method in accordance with one embodiment of this inventive concept. In this manufacturing method, a separation region 205 is formed between the first and the second buried layers and has an opposite conductive type with the first and the second buried layers. By neutralizing charge carriers in the first and the second buried layers with opposite charge carriers, the separation region 205 insulates the first buried layer from the second buried layer. This insulation allows a shorter inter-layer distance between the first and the second buried layers and, as a result, a smaller area budge of a substrate than that required by conventional methods. Additionally, in this manufacturing method, the second ion implantation (the ion implantation that forms the separation region) can be conducted without the first hard mask layer being removed, therefore the separation region may be formed by a single lithography process, which simplifies the manufacturing process.

In one embodiment, an annealing process may be conducted after the semiconductor layer 208 is formed, this process is described below with reference to FIGS. 2F, 2G and 2H.

Figure 2F:
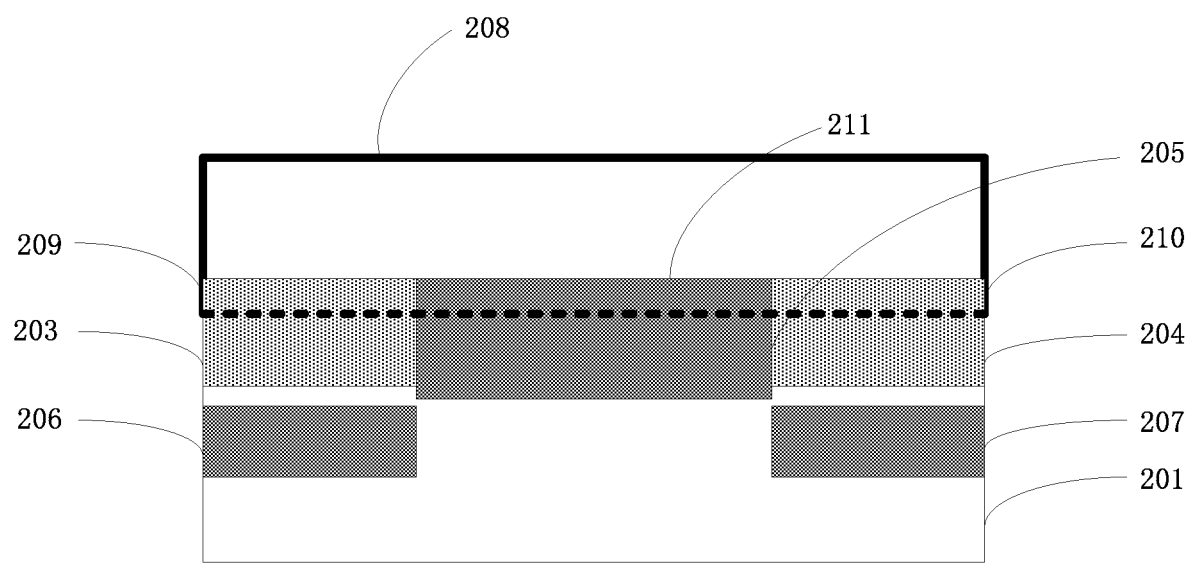

Referring to FIG. 2F, an annealing process is conducted. Since the first buried layer 203 and the second buried layer 204 comprise the first dopant and the second dopant, the annealing process causes at least a portion of the second dopant, which has a lighter atomic weight, to diffuse to the semiconductor layer 208 to form a first diffuse region 209 on the first buried layer 203 and a second diffuse region 210 on the second buried layer 204 in the semiconductor layer 208. In another embodiment, the annealing process may also cause at least a portion of a dopant in the separation region 205 to diffuse to the semiconductor layer 208 to form a third diffuse region 211 on the separation region 205 in the semiconductor layer 208.

Figure 2G:
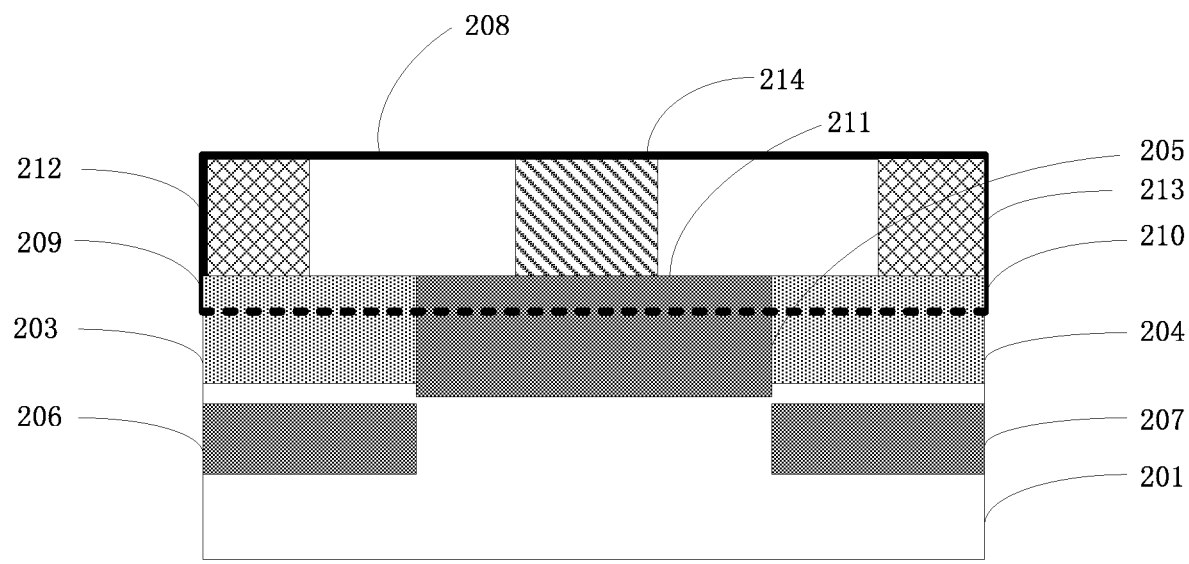

Next, referring to FIG. 2G, a first connection component 212, a second connection component 213, and a third connection component 214 are formed. The first connection component 212 extends from an upper surface of the semiconductor layer 208 to the first diffuse region 209, the second connection component 213 extends from the upper surface of the semiconductor layer 208 to the second diffuse region 210, and the third connection component 214 extends from the upper surface of the semiconductor layer 208 to the third diffuse region 211. The first connection component 212 and the second connection component 213 both have the first conductive type, that is, they have the same conductive type as the first buried layer 203, the second buried layer 204, the first diffuse region 209, and the second diffuse region 210. The third connection component 214 has the second conductive type, that is, it has the same conductive type as the separation region 205 and the third diffuse region 211.

In one embodiment, the first connection component 212 and the second connection component 213 may be formed through the following process: first, form a patterned second hard mask layer (not shown in the drawings) on the semiconductor layer 208, with the second hard mask layer having a first opening and a second opening each exposing a portion of the semiconductor layer 208; then, conduct a third ion implantation to dope the portion of the semiconductor layer 208 underneath the first opening and the second opening to form the first connection component 212 and the second connection component 213, respectively; then, remove the second hard mask layer.

In one embodiment, the third connection component 214 may be formed through the following process: first, form a patterned third hard mask layer (not shown in the drawings) on the semiconductor layer 208, with the third hard mask layer having a third opening exposing a portion of the semiconductor layer 208; then, conduct a fourth ion implantation to dope the portion of the semiconductor layer 208 underneath the third opening to form the third connection component 214; then, remove the third hard mask layer.

It should be understood that the third connection component 214 may be formed either before or after the first connection component 212 and the second connection component 213 are formed. The disclosure does not intend to limit the order in which these connection components may be formed.

Figure 2H:
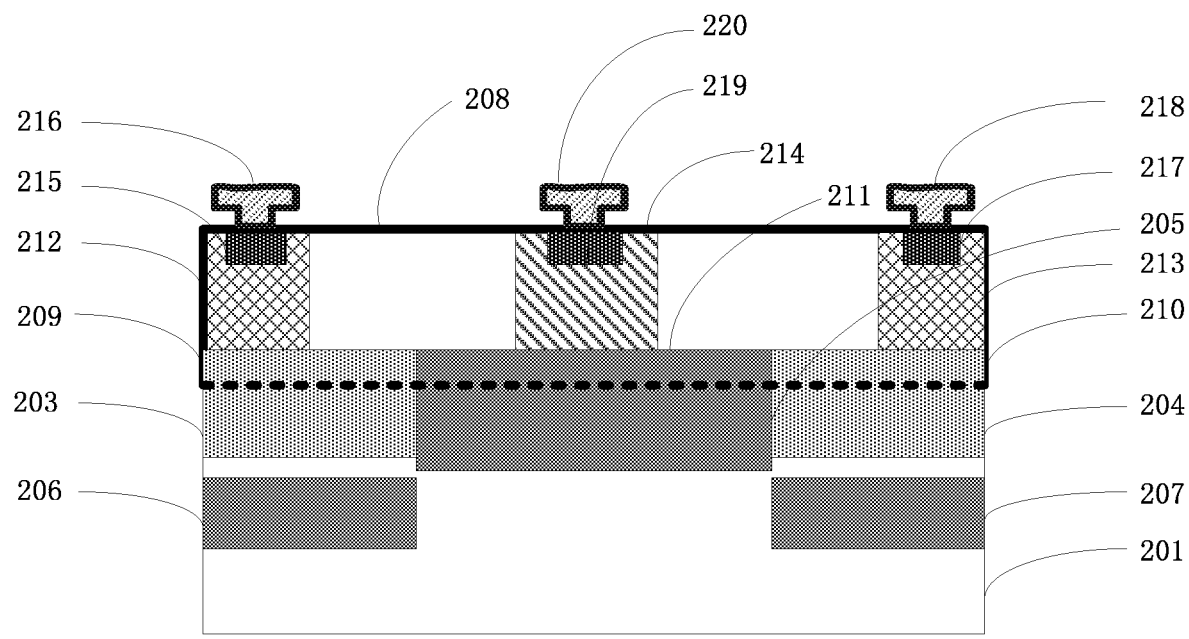

Next, referring to FIG. 2H, a first contact 215 may be formed in the first connection component 212, and a first contact component 216 may be formed on the first contact 215. Additionally, a second contact 217 may be formed in the second connection component 213, and a second contact component 218 may be formed on the second contact 217; a third contact 219 may be formed in the third connection component 214, and a third contact component 220 may be formed on the third contact 219. Electrical voltages may be applied on the first buried layer 203, the second buried layer 204, and the separation region 205 through the first contact component 216, the second contact component 218, and the third contact component 220, respectively. Metal silicide may first be formed on each of the first contact 215, the second contact 217, and the third contact 219, then the first contact component 216, the second contact component 218, and the third contact component 220 may be formed on the respective metal silicide.

In one embodiment, the first contact 215, the second contact 217, and the third contact 219 may be formed through ion implantation processes. The first contact 215 may have the first conductive type and have a doping concentration larger than that of the first connection component 212, the second contact 217 may have the first conductive type and have a doping concentration larger than that of the second connection component 213, and the third contact 219 may have the second conductive type and have a doping concentration larger than that of the third connection component 214.

To ensure sufficient space in the semiconductor layer 208 for various semiconductor devices, the space occupied by the first connection component 212, the second connection component 213, and the third connection component 214 should be kept at a minimum, that in turn requires the sizes of the first opening, the second opening, and the third opening remain as small as possible. However, when the semiconductor layer 208 is thick, forming the first connection component 212, the second connection component 213, and the third connection component 214 conventionally requires a deep ion implantation process that can only be accomplished by sophisticated implantation equipment with relatively large sizes of the first, the second and the third openings.

With these limitations in mind, this inventive concept includes a two-dopant implantation process to form buried layers. In this ion implantation process, two dopants (one with a heavier atomic weight than the other) are implanted. In a succeeding annealing process, the dopant with a lighter atomic weight will diffuse into the semiconductor layer 208 to form the first diffuse region 209, the second diffuse region 210, and the third diffuse region 211 in the semiconductor layer 208. Therefore, the first connection component 212, the second connection component 213, and the third connection component 214 may be formed without a deep ion implantation process. This allows the first, the second, and the third opening to have smaller sizes than those required by conventional methods, which in turn reduces the size of the first connection component 212, the second connection component 213, and the third connection component 214, and allows more space in the semiconductor layer 208 for devices than conventional methods. Alternatively, with the same space allocated for device, this process allows a smaller area budget of a substrate than conventional methods.

Figure 3:
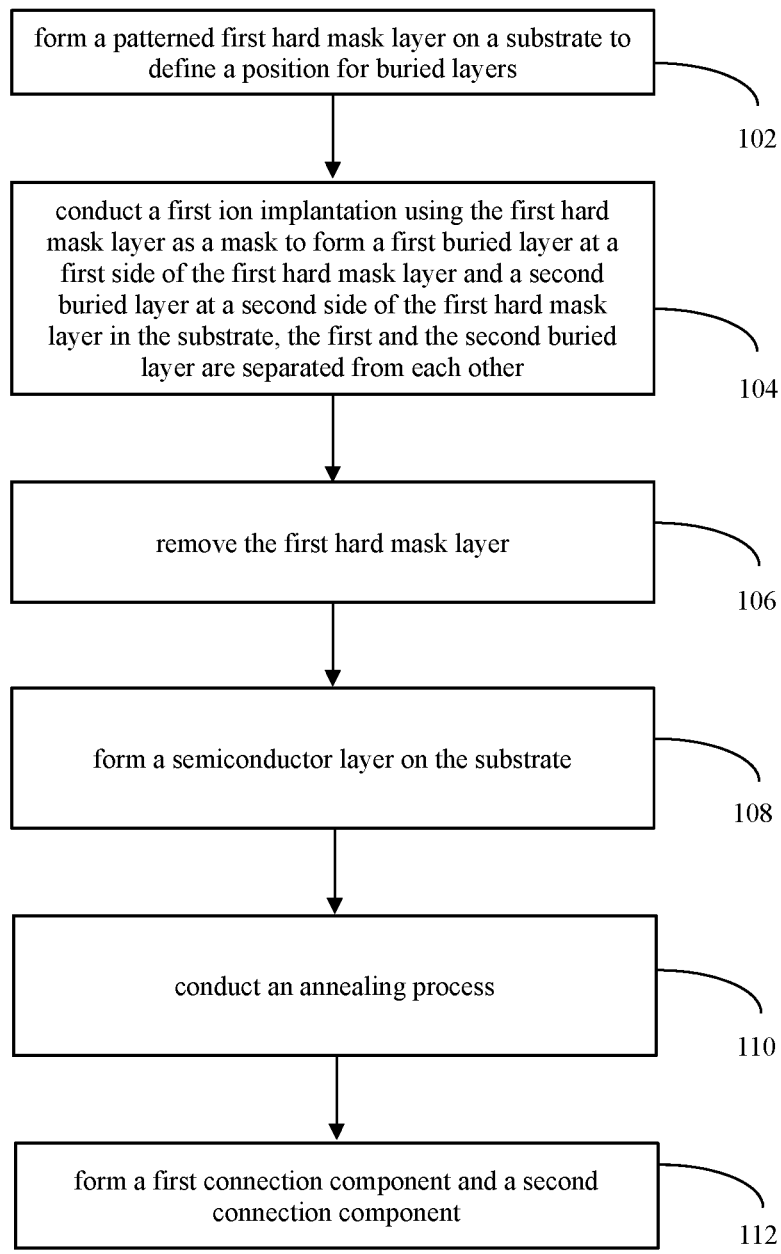
FIG. 3 shows a simplified flowchart illustrating a semiconductor device manufacturing method in accordance with another embodiment of this inventive concept.

FIG. 3 shows a simplified flowchart illustrating a semiconductor device manufacturing method in accordance with another embodiment of this inventive concept, and FIGS. 4A, 4B, 4C, 4D, 4E, 4F, and 4G show schematic sectional views illustrating different stages of this semiconductor device manufacturing method. This semiconductor device manufacturing method is described below with reference to these drawings.

Figure 4A:
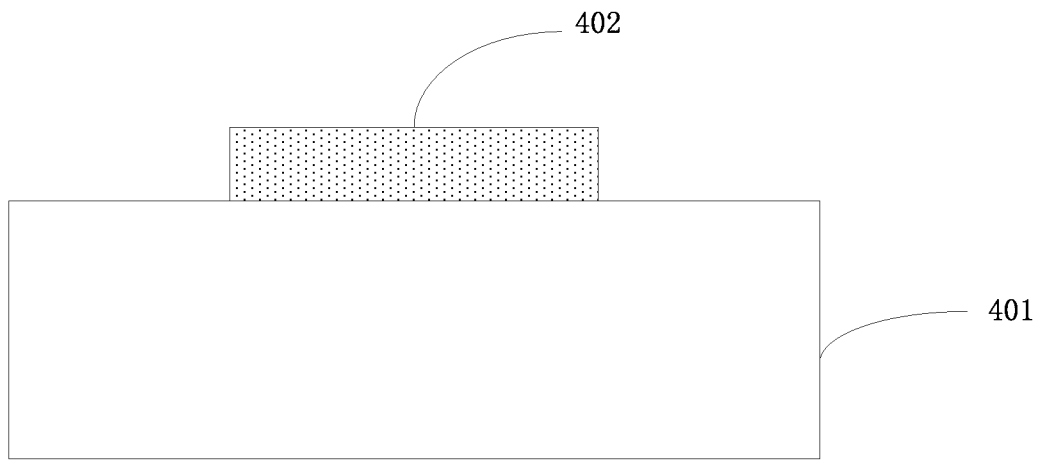
FIGS. 4A, 4B, 4C, 4D, 4E, 4F, and 4G show schematic sectional views illustrating different stages of a semiconductor device manufacturing method in accordance with another embodiment of this inventive concept.

First, referring to FIG. 3, in step 302, a patterned first hard mask layer 402 (which may be a photoresist) is formed on the substrate 401 to define a position for buried layers, as shown in FIG. 4A.

Figure 4B:
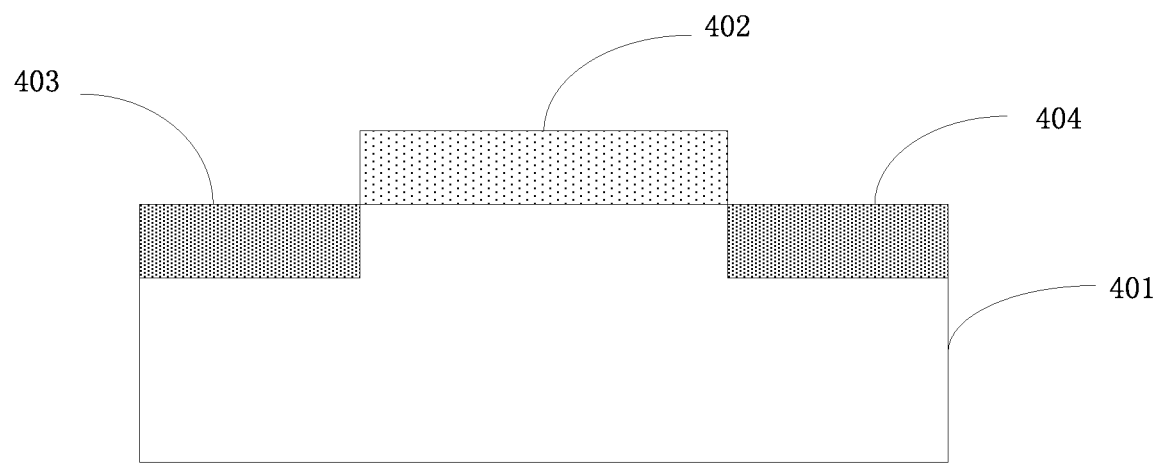

Next, in step 304, a first ion implantation using the first hard mask layer 402 as a mask is conducted to form a first buried layer 403 at a first side of the first hard mask layer 402 and a second buried layer 404 at a second side of the first hard mask layer 402 in the substrate 401, the first and the second buried layers are separated from each other, as shown in FIG. 4B.

The first buried layer 403 and the second buried layer 404 may both have a first conductive type and both comprise a first dopant (a heavy dopant) and a second dopant (a light dopant), with the second dopant having a lighter atomic weight than the first dopant.

Figure 4C:
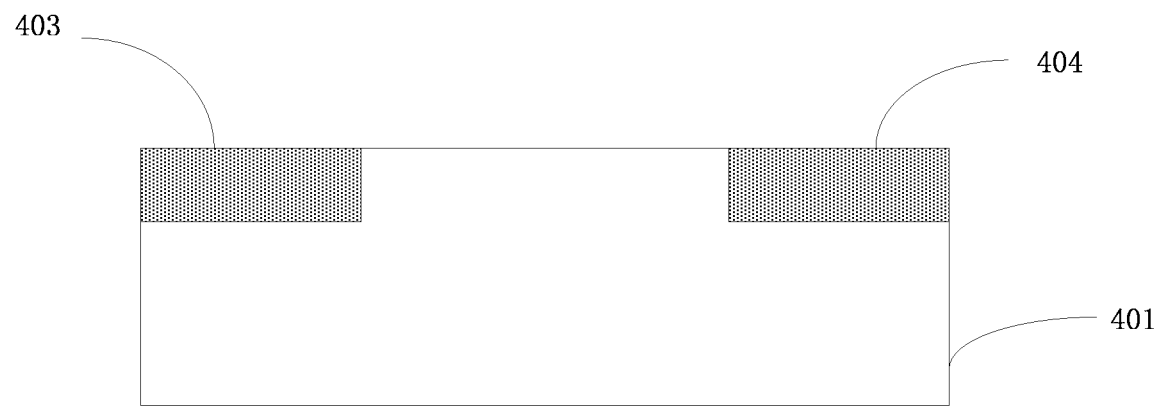

Next, in step 306, the first hard mask layer 402 is removed, as shown in FIG. 4C.

Figure 4D:
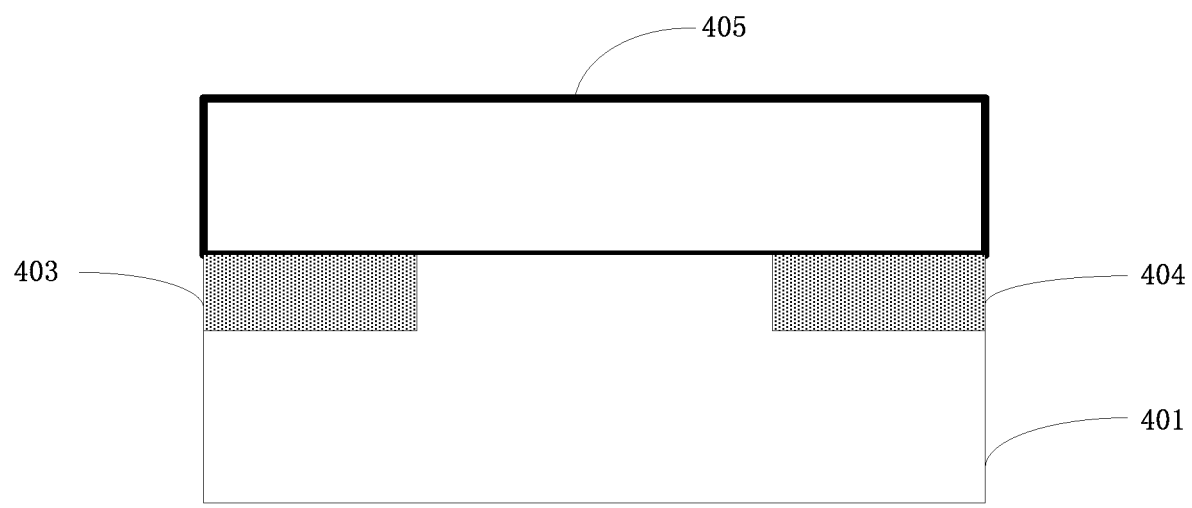

Next, in step 308, a semiconductor layer 405 is formed on the substrate 401 through, for example, epitaxial growth, as shown in FIG. 4D.

Figure 4E:
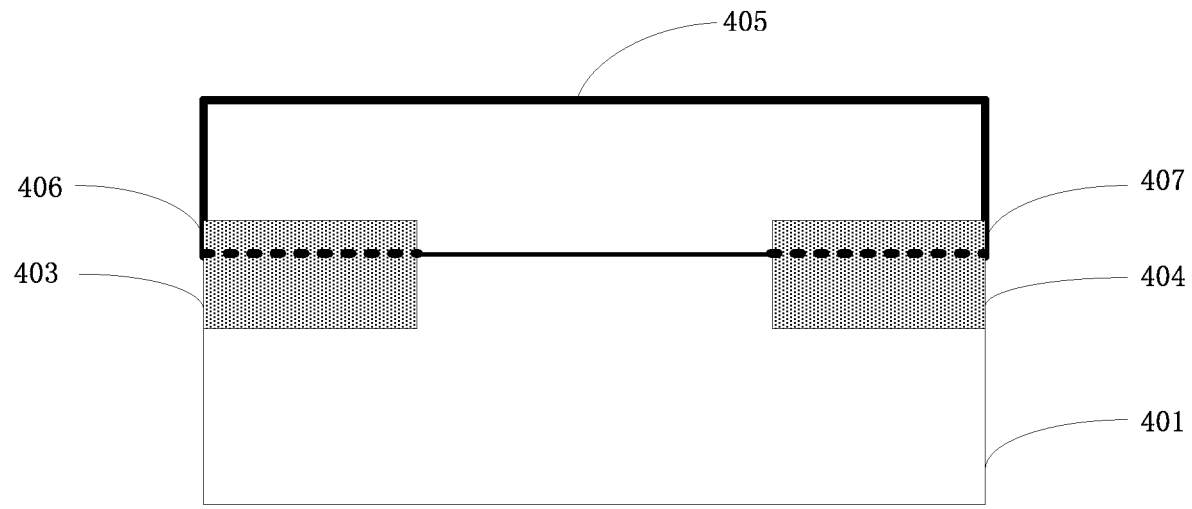

Next, in step 310, an annealing process is conducted, the annealing process causes at least a portion of the second dopant in the first buried layer 403 and the second buried layer 404 to diffuse to the semiconductor layer 405 to form a first diffuse region 406 on the first buried layer 403 and a second diffuse region 407 on the second buried layer 404 in the semiconductor layer 405, as shown in FIG. 4E.

Figure 4F:
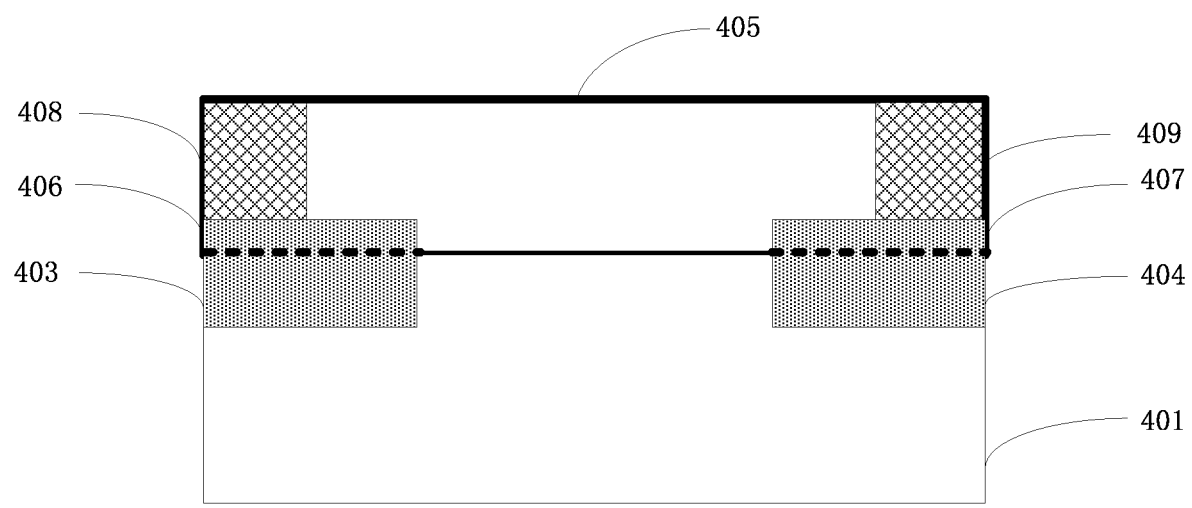

Next, in step 312, a first connection component 408 and a second connection component 409 are formed, as shown in FIG. 4F. The first connection component 408 and the second connection component 409 both have the first conductive type, the first connection component 408 extends from an upper surface of the semiconductor layer 405 to the first diffuse region 406, and the second connection component 409 extends from the upper surface of the semiconductor layer 405 to the second diffuse region 407.

In one embodiment, the first connection component 408 and the second connection component 409 may be formed through the following process: first, form a patterned second hard mask layer (not shown in the drawings) on the semiconductor layer 405, with the second hard mask layer having a first opening and a second opening each exposing a portion of the semiconductor layer 405; then, conduct a second ion implantation to dope the portion of the semiconductor layer 405 underneath the first opening and the second opening to form the first connection component 408 and the second connection component 409, respectively; then, remove the second hard mask layer.

This concludes the description of a semiconductor device manufacturing method in accordance with another embodiment of this inventive concept. In this manufacturing method, two dopants—one heavy dopant and one light dopant—are implanted to the buried layers in the ion implantation process. In a succeeding annealing process, the light dopant will diffuse into the semiconductor layer 405 to form a first diffuse region 406 and a second diffuse region 407 in the semiconductor layer 405. In this manufacturing method, the first connection component 408 and the second connection component 409 may be formed without a deep ion implantation process, this allows the first and the second openings to have smaller sizes than those required by conventional methods, which in turn reduces the size of the first connection component 408 and the second connection component 409, and allows more space in the semiconductor layer 208 for devices than conventional methods. Alternatively, with the same space allocated for devices, this process allows a smaller area budget of a substrate than conventional methods.

Figure 4G:
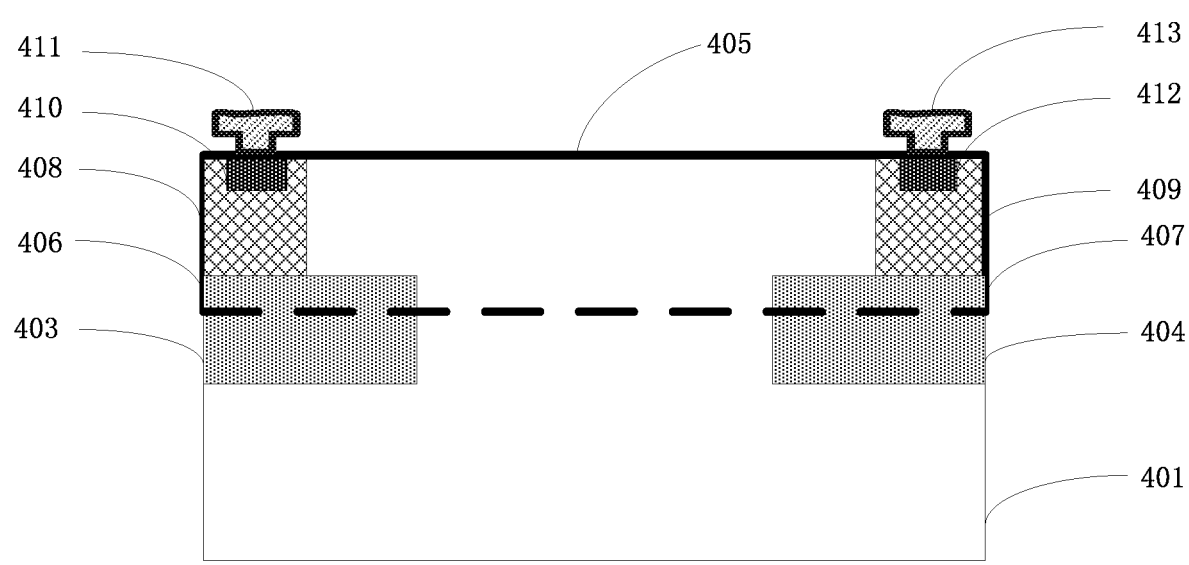

Referring to FIG. 4G, in one embodiment, a first contact 410 may be formed in the first connection component 408, and a first contact component 411 may be formed on the first contact 410. Additionally, a second contact 412 may be formed in the second connection component 409, and a second contact component 413 may be formed on the second contact 412. Electrical voltages may be applied on the first buried layer 403 and the second buried layer 404 through the first contact component 411 and the second contact component 413, respectively. In one embodiment, the first contact 410 and the second contact 412 may be formed by an ion implantation process, the first contact 410 may have the first conductive type and a doping concentration higher than that of the first connection component 409, and the second contact 412 may have the first conductive type and a doping concentration higher than that of the second connection component 409.

Different semiconductor devices may be formed through the manufacturing methods described above, these semiconductor devices are described below.

Referring to FIG. 2F, a semiconductor device in accordance with one embodiment of this inventive concept may comprise a substrate 201 and a semiconductor layer 208 on the substrate 201. The substrate 201 may comprise: a first buried layer 203 and a second buried layer 204 separated from each other; a separation region 205 between the first buried layer 203 and the second buried layer 204; a first doped region 206 underneath the first buried layer 203; and a second doped region 207 underneath the second buried layer 204. In this embodiment, the first buried layer 203 and the second buried layer 204 may both have a first conductive type (e.g., N-type), while the separation region 205, the first doped region 206, and the second doped region 207 may all have a second conductive type (e.g. P-type) opposite to the first conductive type.

Referring to FIG. 2F, in one embodiment, the first buried layer 203 and the second buried layer 204 may both comprise a first dopant and a second dopant, with the second dopant having a lighter atomic weight than the first dopant. In this embodiment, the semiconductor layer 208 may comprise a first diffuse region 209 on the first buried layer 203 and a second diffuse region 210 on the second buried layer 204, with the first diffuse region 209 and the second diffuse region 210 both comprising the second dopant.

Referring to FIG. 2F, in one embodiment, the semiconductor layer 208 may further comprise a third diffuse region 211 on the separation region 205.

Referring to FIG. 2G, in one embodiment, the semiconductor device may further comprise a first connection component 212 and a second connection component 213 both having the first conductive type, and a third connection component 214 having the second conductive type. The first connection component 212 extends from an upper surface of the semiconductor layer 208 to the first diffuse region 209, the second connection component 213 extends from the upper surface of the semiconductor layer 208 to the second diffuse region 210, and the third connection component 214 extends from the upper surface of the semiconductor layer 208 to the third diffuse region 211.

Referring to FIG. 2H, in one embodiment, the semiconductor device may further comprise: a first contact 215 in the first connection component 212, a first contact component 216 on the first contact 215, a second contact 217 in the second connection component 213, a second contact component 218 on the second contact 217, a third contact 219 in the third connection component 214, and a third contact component 220 on the third contact 219.

This inventive concept further presents another semiconductor device. Referring to FIG. 4G, this semiconductor device comprises a substrate 401, a semiconductor layer 405 on the substrate 401, a first connection component 408, and a second connection component 409.

The substrate 401 comprises a first buried layer 403 and a second buried layer 404 separated from each other, the first buried layer 403 and the second buried layer 404 both have a first conductive type, and both comprise a first dopant and a second dopant, with the second dopant having a lighter atomic weight than the first dopant.

The semiconductor layer 405 comprises a first diffuse region 406 on the first buried layer 403 and a second diffuse region 407 on the second buried layer 404, with the first diffuse region 406 and the second diffuse region 407 both comprising the second dopant.

The first connection component 408 and the second connection component 409 both have the first conductive type, the first connection component 408 extends from an upper surface of the semiconductor layer 405 to the first diffuse region 406, and the second connection component 409 extends from the upper surface of the semiconductor layer 405 to the second diffuse region 407.

Referring to FIG. 4G, in one embodiment, this semiconductor device may further comprise a first contact 410 in the first connection component 408, a first contact component 411 on the first contact 410, a second contact 412 in the second connection component 409, and a second contact component 413 on the second contact 412.

This concludes the description of a semiconductor device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
    a substrate, comprising:
        a first buried layer and a second buried layer separated from each other;
        a separation region between the first buried layer and the second buried layer;
        a first doped region underneath the first buried layer; and
        a second doped region underneath the second buried layer, and
    a semiconductor layer positioned on the substrate and comprising a diffuse portion, wherein the diffuse portion overlaps the separation region, wherein a dopant of the diffuse portion is identical to a dopant of the separation region, wherein the first and the second buried layers both have a first conductive type, while the separation region, the first doped region, and the second doped region all have a second conductive type opposite to the first conductive type.

2. The semiconductor device of claim 1, wherein the first and the second buried layers both comprise a first dopant and a second dopant, with the second dopant having a lighter atomic weight than the first dopant,
    and wherein the semiconductor layer comprises a first diffuse region on the first buried layer and a second diffuse region on the second buried layer, with the first and the second diffuse regions both comprising the second dopant.

3. The semiconductor device of claim 2, wherein the diffuse portion directly contacts the separation region.

4. The semiconductor device of claim 3, further comprising:
- a first connection component extending from an upper surface of the semiconductor layer to the first diffuse region;
- a second connection component extending from the upper surface of the semiconductor layer to the second diffuse region; and
- a third connection component extending from the upper surface of the semiconductor layer to the diffuse portion, wherein the first and the second connection components both have the first conductive type and the third connection component has the second conductive type.

5. The semiconductor device of claim 4, further comprising:
- a first contact in the first connection component, and a first contact component on the first contact;
- a second contact in the second connection component, and a second contact component on the second contact; and
- a third contact in the third connection component, and a third contact component on the third contact.

6. A semiconductor device, comprising:
a substrate, comprising:
- a first buried layer and a second buried layer separated from each other in the substrate, wherein the first and the second buried layers both have a first conductive type and both comprise a first dopant and a second dopant, with the second dopant having a lighter atomic weight than the first dopant;
- a semiconductor layer on the substrate, comprising a first diffuse region on the first buried layer and a second diffuse region on the second buried layer, with the first and the second diffuse regions both comprising the second dopant;
- a first connection component extending from an upper surface of the semiconductor layer to the first diffuse region; and
- a second connection component extending from the upper surface of the semiconductor layer to the second diffuse region, with the first and the second connection components both having the first conductive type.

7. The semiconductor device of claim 6, further comprising:
- a first contact in the first connection component, and a first contact component on the first contact; and
- a second contact in the second connection component, and a second contact component on the second contact.

* * * * *